US010024570B2

(12) United States Patent
Azumi et al.

(10) Patent No.: US 10,024,570 B2
(45) Date of Patent: Jul. 17, 2018

(54) INDOOR UNIT FOR AIR CONDITIONING DEVICE

(71) Applicant: DAIKIN INDUSTRIES, LTD., Osaka (JP)

(72) Inventors: Kouji Azumi, Osaka (JP); Tomoo Masuda, Osaka (JP); Takayoshi Yamamoto, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/619,963

(22) Filed: Jun. 12, 2017

(65) Prior Publication Data

US 2017/0276396 A1 Sep. 28, 2017

Related U.S. Application Data

(63) Continuation of application No. PCT/JP2015/084929, filed on Dec. 14, 2015.

(30) Foreign Application Priority Data

Dec. 17, 2014 (JP) ................................. 2014-255635

(51) Int. Cl.
*F24F 13/20* (2006.01)
*F24F 13/32* (2006.01)
(Continued)

(52) U.S. Cl.
CPC .............. *F24F 13/20* (2013.01); *F24F 13/32* (2013.01); *H01B 11/12* (2013.01); *F24F 2013/207* (2013.01); *H05K 5/0247* (2013.01)

(58) Field of Classification Search
CPC ...... F24F 13/20; F24F 13/32; F24F 2013/207; H01B 11/12; H05K 5/0247; F25D 23/12; A47B 97/00
See application file for complete search history.

(56) References Cited

U.S. PATENT DOCUMENTS 6,082,127 A * 7/2000 Correa ..................... F24F 13/20
62/262
6,300,564 B1 * 10/2001 Moraes ................ H05K 5/0247
174/535

(Continued)

FOREIGN PATENT DOCUMENTS

CN 102291962 A 12/2011
CN 203231461 U 10/2013
(Continued)

OTHER PUBLICATIONS

International Preliminary Report on Patentability and Written Opinion issued in corresponding International Application No. PCT/JP2015/084929 dated Jun. 29, 2017 (6 pages).

(Continued)

*Primary Examiner* — Filip Zec
(74) *Attorney, Agent, or Firm* — Osha Liang LLP (57) ABSTRACT

An indoor unit of an air conditioning system is provided. The indoor unit includes a fan, a control box that includes an inspection port on a first side surface, and a casing that houses the fan and the control box. The casing includes a first flow port in a bottom surface of the casing, a second flow port in a first side surface of the casing, and an opening opposed to the inspection port in a second side surface of the casing. The control box comprises a first leading port on each of a second side surface and a third side surface of the control box, the second side surface and the third side surface are opposed to each other and adjacent to the first side surface, and the first leading ports lead external wirings into the control box.

7 Claims, 10 Drawing Sheets

(51) Int. Cl.
*H01B 11/12* (2006.01)
*H05K 5/02* (2006.01)

(56) References Cited

U.S. PATENT DOCUMENTS

| | | | | |
|---|---|---|---|---|
| 6,305,765 | B1* | 10/2001 | Park | F24F 13/20 |
| | | | | 312/223.1 |
| 6,389,831 | B1* | 5/2002 | An | F24F 1/027 |
| | | | | 62/262 |
| 6,470,699 | B1* | 10/2002 | Okuda | F24F 1/0007 |
| | | | | 62/259.2 |
| 8,272,229 | B2* | 9/2012 | Choi | F24F 1/0007 |
| | | | | 62/259.1 |
| 9,674,977 | B2* | 6/2017 | Kaneoya | F24F 13/20 |
| 9,746,231 | B2* | 8/2017 | Moon | F25D 17/06 |
| 2015/0009626 | A1* | 1/2015 | Lan | H05K 7/20163 |
| | | | | 361/696 |
| 2016/0209055 | A1* | 7/2016 | Gedcke | F24F 1/02 |

FOREIGN PATENT DOCUMENTS

| | | |
|---|---|---|
| JP | S57-114316 U | 7/1982 |
| JP | H04-95218 U | 8/1992 |
| JP | 2000-249362 A | 9/2000 |
| JP | 2000-249364 A | 9/2000 |
| WO | 2013/129527 A1 | 9/2013 |

OTHER PUBLICATIONS

Office Action issued in corresponding Japanese Application No. 2014-255635 dated Sep. 6, 2016, and English translation thereof (6 pages).
International Search Report issued in corresponding International Application No. PCT/JP2015/084929 dated Mar. 15, 2016 (2 pages).
Office Action issued in corresponding Japanese Application No. 2014-255635 dated Mar. 8, 2016, and English translation thereof (4 pages).

* cited by examiner

INDOOR UNIT FOR AIR CONDITIONING DEVICE

TECHNICAL FIELD

The present invention relates to an indoor unit of an air conditioning device, and particularly to an indoor unit of an air conditioning device that can make easier leading of electric wiring to a control box.

BACKGROUND

A conventional air conditioning device used for indoor heating and cooling of a building or the like includes a ceiling-embedded duct type indoor unit (for example, refer to Patent Literature 1).

The ceiling-embedded duct type indoor unit can have a first configuration in which indoor air is sucked in from a lower surface of a casing and a second configuration in which the air is sucked in from a back surface of the casing. The indoor unit described in Patent Literature is enabled to selectively employ either the first configuration or the second configuration.

Moreover, as to the indoor unit described in Patent Literature 1, a control box disposed inside the casing is shared between the first configuration and the second configuration. Specifically, an inspection port is formed in one side surface of the control box, and in the first configuration (lower surface suction), the inspection port of the control box is disposed so as to direct an inside of the casing, so that the inside of the control box can be accessed through the inspection port from a flow port (suction port). On the other hand, in the second configuration (a back surface suction), the control box is inverted, and the inspection port is disposed to direct an outside of the casing, so that the inside of the control box can be accessed through the inspection port from an outside of the casing.

CITATION LIST

[Patent Literature]

Patent Literature 1: Japanese Unexamined Patent Publication No. 2000-249364

Strong electricity wiring such as a power line, and weak electricity wiring used for communication of a control signal or the like are led into this type of control box from the outside of the casing. It is common for the strong electricity wiring and the weak electricity wiring to be led into the control box from different places to reduce the influence of noise. Accordingly, regardless of whether an inspection port of the control box is facing the inside or the outside of the casing, the strong electricity wiring and the weak electricity wiring must be individually led in.

In a technique described in Patent Literature 1, the external wiring is led into the control box from one place. Thus, Patent Literature 1 has not considered that the different types of electrical wiring, such as the strong electricity wiring and the weak electricity wiring, are individually led in from outside.

SUMMARY

One or more embodiments of the present invention provide an indoor unit of an air conditioning device capable of individually leading different types of external wiring into a control box, even when the control box is inverted inside a casing.

(1) One or more embodiments of the present invention provide an indoor unit that includes a casing configured to contain (i.e., that houses) a fan and a control box, and can select a first configuration in which a first flow port configured to cause air to flow by the fan is formed in a bottom surface of the casing, and a second configuration in which a second flow port is formed in one side surface of the casing, wherein the control box includes a first side surface in which an inspection port is formed, the control box being disposed inside the casing in a state where the inspection port is directed to an inside of the casing in the first configuration, or in a state where the inspection port is directed to an outside of the casing in the second configuration, in second and third side surfaces of the control box, first leading ports configured to lead external wiring into the control box are formed, respectively, the second and third side surfaces being adjacent to the first side surface and opposed to each other, and in another surface of the casing, an opening opposed to the inspection port, and second leading ports disposed on both side portions of this opening and configured to lead the external wiring into the casing in the second configuration are formed.

According to one or more embodiments, in both the cases of the first configuration and the second configuration, the two types of external wiring can be individually led into the casing through the second leading ports, and further, the respective types of external wiring can be individually led into the control box through the first leading ports.

(2) Strong electricity wiring and weak electricity wiring may be individually led into the first leading ports formed in the second and third side surfaces, respectively.

One or more embodiments of the invention can avoid influence of noise attributed to a situation that the strong electricity wiring and the weak electricity wiring are led in through one leading port.

(3) When two terminal blocks are disposed side by side in an opposite direction to the second side surface and the third side surface inside the control box, the respective types of wiring connected to the respective terminal blocks may be individually led into the two first leading ports formed in the second and third side surfaces, respectively.

One or more embodiments of the invention enable the external wiring connected to the respective terminal blocks to be led in through the closest leading ports.

(4) In one or more embodiments, in the second and third side surfaces of the control box, first guide paths extending from the first leading port sides to the first side surface to guide the external wiring, and second guide paths extending from the first leading port sides to a fourth side surface opposed to the first side surface to guide the external wiring are formed.

One or more embodiments of the invention enable the leading of the external wiring into the first leading ports to be easily performed in both the first configuration and the second configuration.

(5) In one or more embodiments, inside the casing, a support portion configured to engage with, and support the control box is formed, and in the control box, a first engagement portion configured to engage with the support portion in the first configuration, and a second engagement portion configured to engage with the support portion in the second configuration are provided.

One or more embodiments of the invention allow the engagement portions to engage with the same support portion and support the control box in both the first configuration and the second configuration.

(6) In one or more embodiments, on a bottom wall of the control box, the terminal blocks configured to connect the external wiring are provided, and the bottom wall is provided swingably downward with one end side as a supporting point.

According to one or more embodiments of the invention, in the first configuration, when the inside of the control box is inspected from a lower surface of the casing, the bottom wall of the control box can be opened to make the access easier.

One or more embodiments of the present invention can also individually lead different types of external wiring into a control box even when the control box is inverted inside a casing.

DETAILED DESCRIPTION

Hereinafter, embodiments of the present invention will be described with reference to the drawings.

Figure 1:
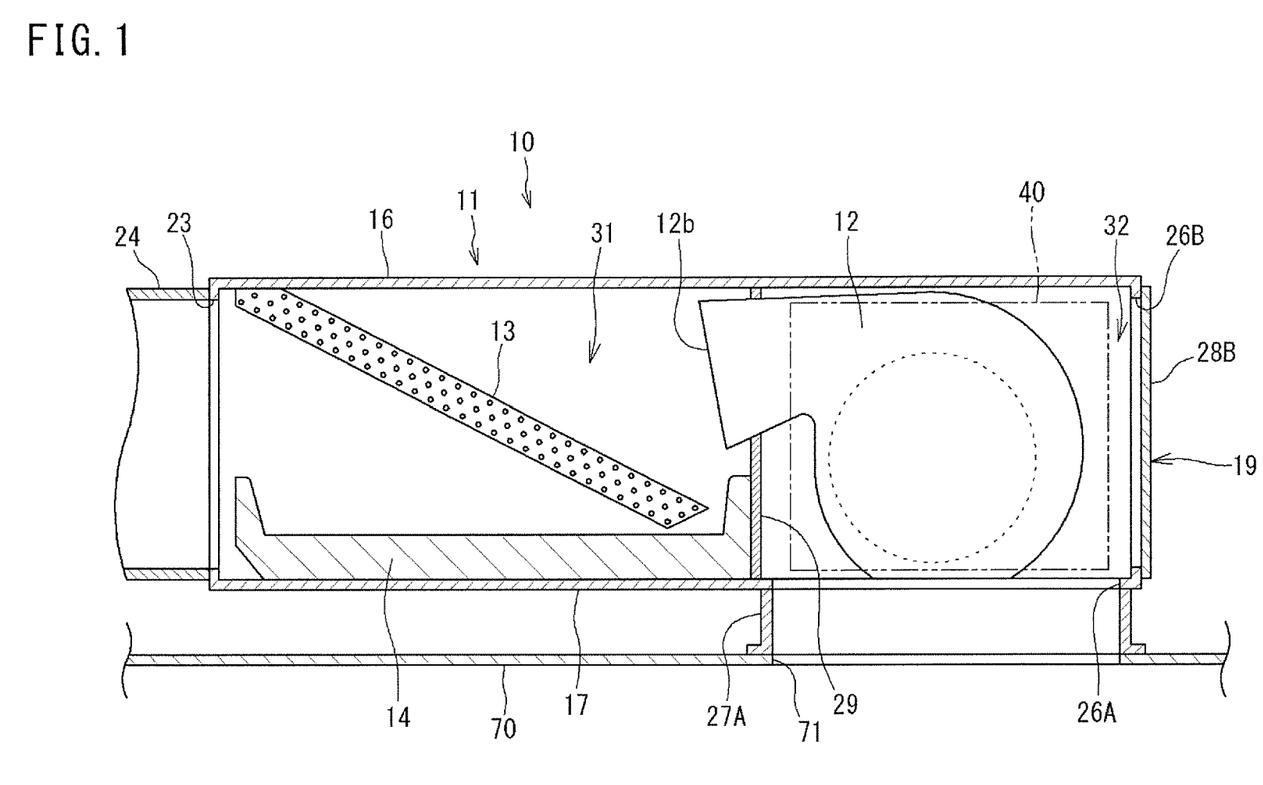
FIG. 1 is an explanatory side view showing an inside of an indoor unit of an air conditioning device according to one or more embodiments of the present invention.
Figure 2:
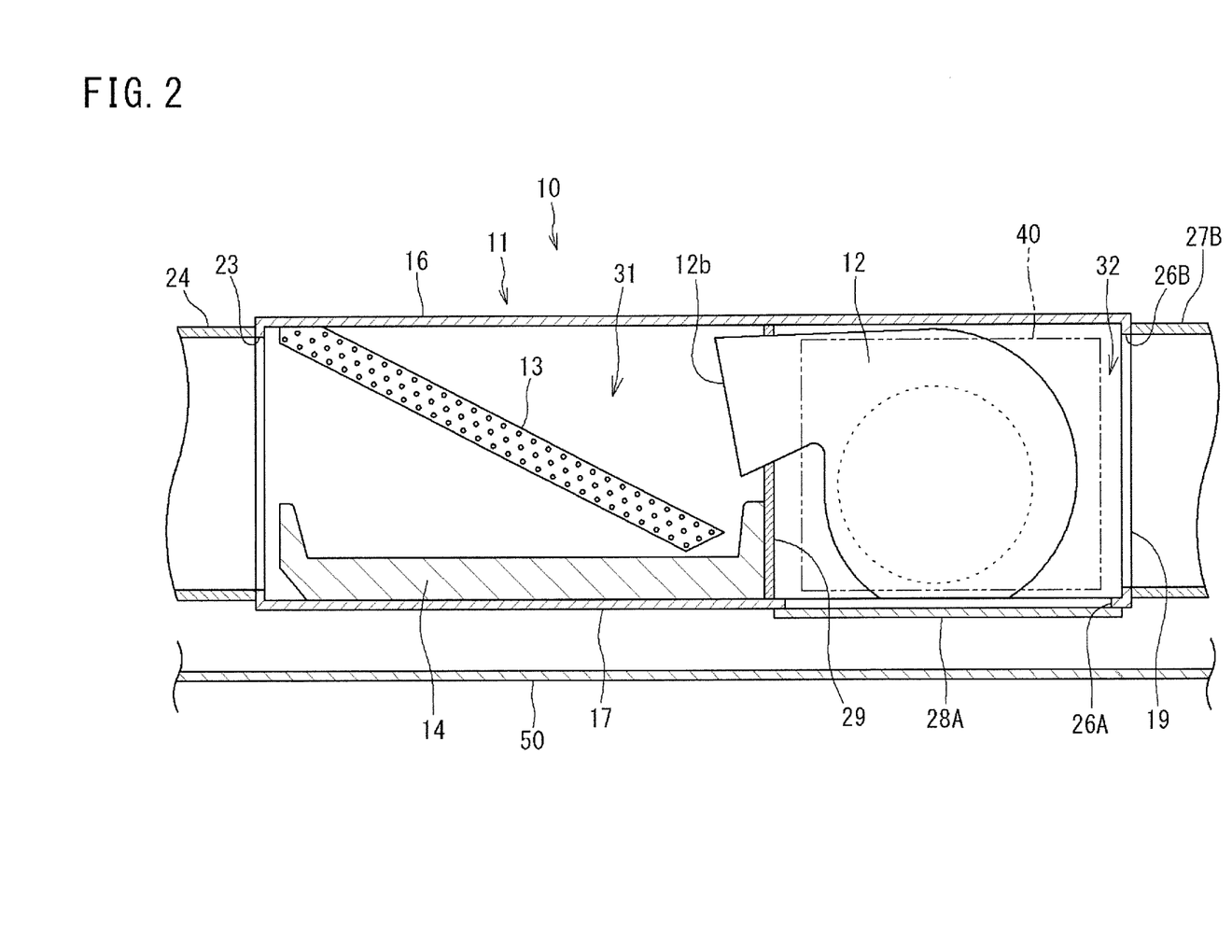
FIG. 2 is an explanatory side view showing the inside of the same indoor unit according to one or more embodiments of the present invention.
Figure 3:
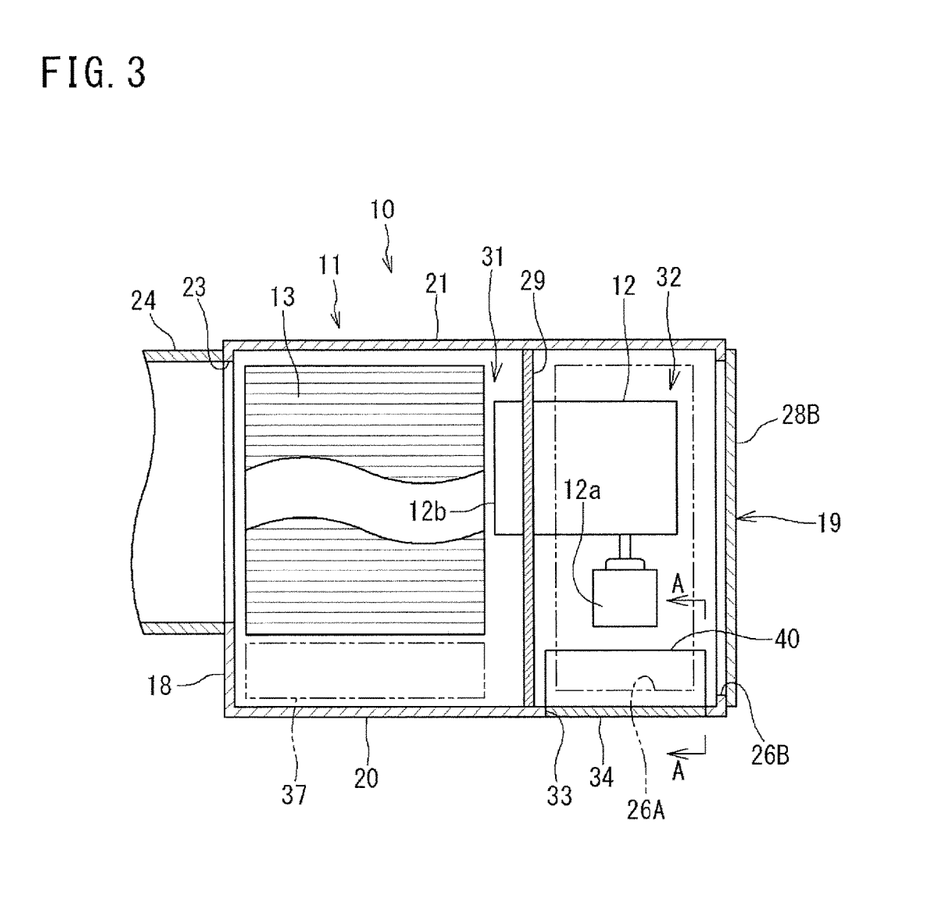
FIG. 3 is an explanatory plan view showing the inside of the indoor unit shown in FIG. 1.
Figure 4:
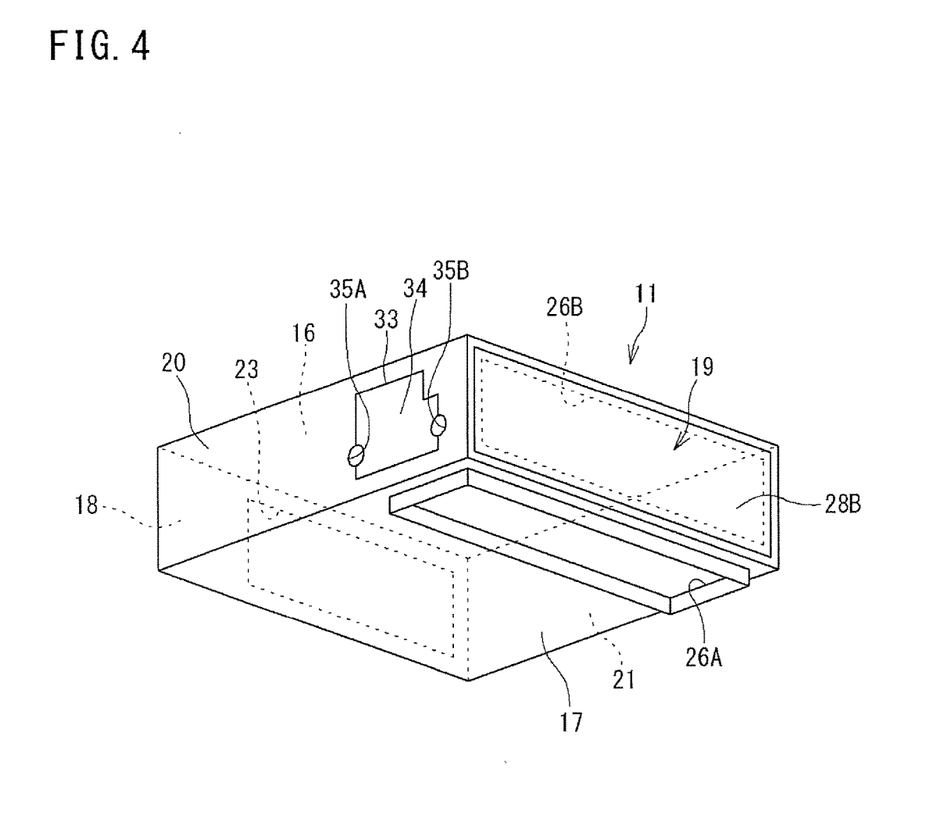
FIG. 4 is a perspective view schematically showing a casing of the indoor unit according to one or more embodiments of the present invention.

FIGS. 1 and 2 are explanatory side views each showing an inside of an indoor unit of an air conditioning device according to one or more embodiments of the present invention. FIG. 3 is an explanatory plan view showing the inside of the indoor unit shown in FIG. 1, and FIG. 4 is a perspective view schematically showing a casing of the indoor unit.

An indoor unit 10 of one or more embodiments is of a ceiling-embedded duct type, which is installed in an attic, and sucks and exhausts air through ducts connected to a ceiling 70. The indoor unit 10 includes a casing 11, a fan 12, a heat exchanger 13, a drain pan 14, and the like.

In one or more embodiments, the casing 11 is a vertically flat, rectangular parallelepiped-shaped box, and has a top plate 16, a bottom plate 17 opposed to this top plate 16 on a lower side, and side plates 18 to 21 provided along four sides of each of the top plate 16 and the bottom plate 17. The side plates 18 to 19 include the front side plate 18, the rear side plate (back surface plate) 19 opposed to this front side plate 18 at the rear, and the left side plate 20 and the right side plate 21 connecting right and left end portions of the front side plate 18 and the rear side plate 19.

The front side plate 18 of the casing 11 is formed with a blowoff port 23 of air. One end of a blowoff duct 24 is connected to this blowoff port 23, and another end (illustration is omitted) of the blowoff duct 24 is connected to the ceiling 70. The blowoff duct 24 may be branched into a plurality of passages.

As to flow ports 26A, 26B (suction ports) of air, there are a case where one is formed on a rear side of the bottom plate 17 as shown in FIG. 1 (a first configuration), and a case where the other is formed in the rear side plate 19 as shown in FIG. 2 (a second configuration). The indoor unit 10 of one or more embodiments can select and apply any of the configurations.

In the first configuration shown in one or more embodiments of FIG. 1, an upper end of a suction duct 27A is connected to the flow port 26A formed in the bottom plate 17, while a lower end of the suction duct 27A is connected to an opening 71 of the ceiling 70. In the second configuration shown in FIG. 2, one end of the suction duct 27B is connected to the flow port 26B formed in the rear side plate 19 and another end of this suction duct 27B (illustration is omitted) is connected to the ceiling 70.

In one or more embodiments as shown in FIG. 1, when the first configuration is selected, the flow port 26B is closed by a closing plate 28B, and this closing plate 28B configures a part of the rear side plate 19.

In one or more embodiments as shown in FIG. 2, when the second configuration is selected, the flow port 26A is closed by a closing plate 28A, and this closing plate 28A configures a part of the bottom plate 17. FIG. 4 shows a state where the flow port 26A is opened, and the flow port 26B is closed by the closing plate 28B when the first configuration is selected.

In one or more embodiments as shown in FIGS. 1 to 3, inside the casing 11, a partition plate 29 extending in a right-left direction is provided substantially parallel to the front side plate 18 and the rear side plate 19. This partition plate 29 partitions an inside of the casing 11 into two front and rear regions 31, 32. The front region 31 of the partition plate 29 is a heat exchange chamber where the heat exchanger 13 is disposed, and the rear region 32 is a blower chamber where a fan 12 is disposed.

The foregoing blowoff port 23 is open in the heat exchange chamber 31, and the flow ports 26A, 26B are open in the blower chamber 32.

The fan 12 is a multi-vane fan such as, for example, a sirocco fan and the like, and is driven by a motor 12a. A casing of the fan 12 is fixed to the partition plate 29 or the like, and a blowoff port 12b is open in the heat exchange chamber 31.

The fan 12 sucks air outside the casing 11 of the indoor unit 10 into the casing 11 through the flow ports 26A, 26B to generate an airflow flowing into the heat exchange chamber 31 in front of the partition plate 29.

The fan 12 is disposed in a state biased to one side in a right-left direction (a right side) inside the blower chamber 32. The control box 40 is disposed on another side in the right-left direction (a left side) in the blower chamber 32. Inside the control box 40, control boards, terminal blocks and the like are contained, and electric wiring is led in from the inside and an outside of the casing 11.

In one or more embodiments as shown in FIG. 4, in the left side plate 20 of the casing 11, leading ports 35A, 35B configured to lead the electric wiring from the outside of the casing 11 are formed at two positions spaced in a front-rear direction. An opening 33 used to enable the access to the control box 40 in the second configuration is formed between the leading ports 35A, 35B at the two positions. This opening 33 is closed by a lid body 34 in the first configuration. Detailed description of this control box 40 will be given later.

In one or more embodiments as shown in FIGS. 1 to 3, the heat exchanger 13 is, for example, a fin and tube type heat exchanger of a cross fin type including a number of fins arranged at predetermined intervals, and heat transfer tubes penetrating these fins. The airflow generated by the fan 12 passes through the heat exchanger 13 and, in this process, heat exchange is performed between a refrigerant flowing in the heat transfer tubes and air. The heat exchanger 13 is disposed obliquely so that an upper side is located on the front side, and a lower side is located on the rear side.

In the air conditioning device, using this heat exchanger 13 as an evaporator enables cooling operation, while using the same as a condenser enables heating operation.

During the cooling operation, dew condensation water generated in the heat exchanger 13 is received by the drain pan 14 disposed under the heat exchanger 13.

In one or more embodiments as shown in FIG. 3, the heat exchanger 13 is disposed so as to be slightly biased to one side in the right-left direction (the right side) inside the heat exchange chamber 31. In a region 37 on another side in the right-left direction (the left side) of the heat exchange chamber 31, a distributor, and a piping group such as a header and the like connected to the heat exchanger 13 as well as electric components such as a drain pump, an indoor expansion valve, a thermistor and the like are disposed. The electric wiring of these electric components penetrates the partition plate 29 from the heat exchange chamber 31 to be led into the control box 40. Moreover, electric wiring to drive the motor 12a of the fan 12 is also led into the control box 40.

<Control Box 40>

Figure 5:
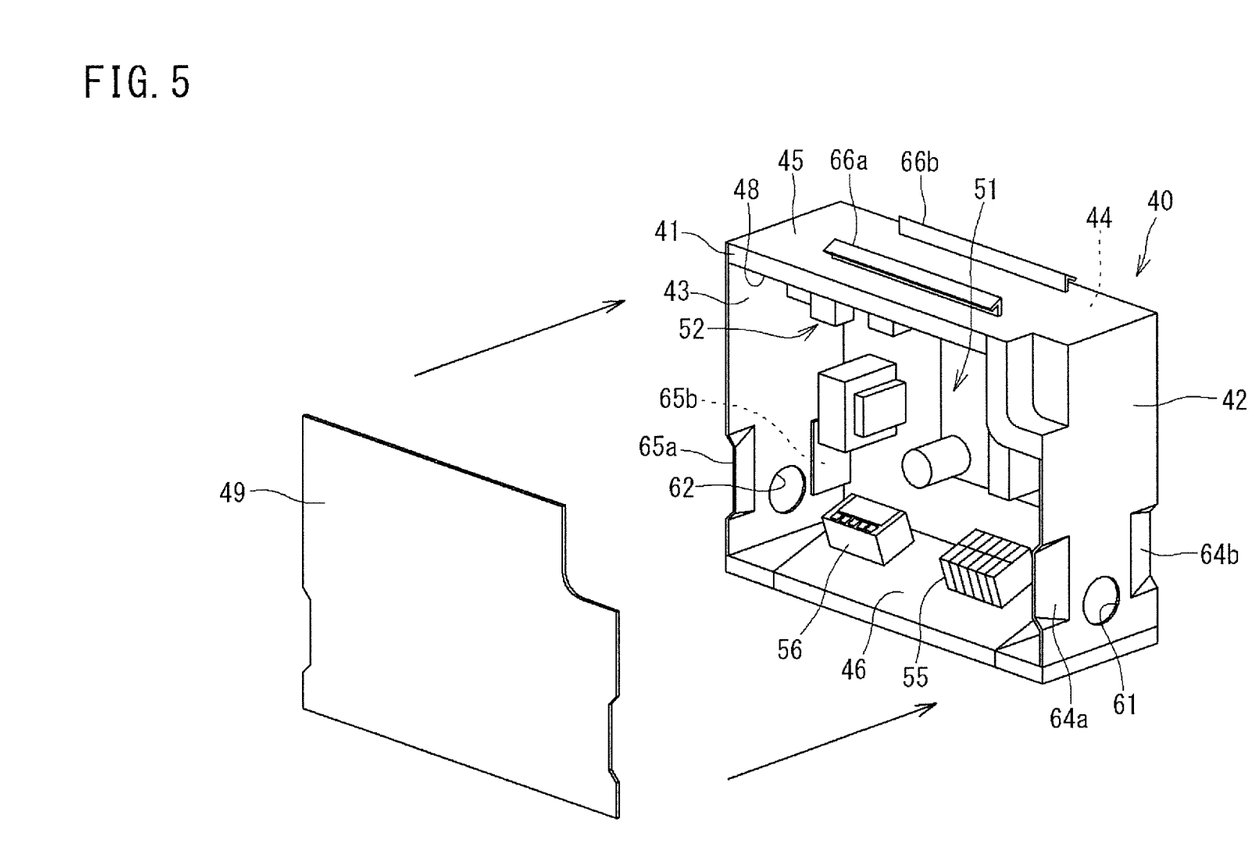
FIG. 5 is a perspective view showing a control box according to one or more embodiments of the present invention.

In one or more embodiments as shown in FIG. 5, the control box 40 is configured by a substantially rectangular parallelepiped (a substantial hexahedron) having an upper wall 45, a bottom wall 46 opposed to the same, and side walls 41 to 44 along four sides of each of the upper wall 45 and the bottom wall 46. The one side wall 41 (a first side surface) of the control box 40 is formed with an inspection port 48 in a substantially whole excluding a part of an outer edge portion thereof. The inspection port 48 is closed by a lid body 49 attached with fixing screws or the like detachably. Accordingly, this lid body 49 configures a substantial side wall of the control box 40.

In the following description, in one or more embodiments, in the control box 40, the side wall 41 in which the inspection port 48 is formed is defined as the front side wall, and the side walls adjacent to both sides of the side wall 41 are defined as the left and right side walls 42, 43 (second and third side surfaces), and the side wall 44 opposed to the rear side of the front side wall 41 is defined as a rear side wall (fourth side surface) 44.

Inside the rear side wall 44 of the control box 40, a control board 51 is provided. Inside the upper wall 45 of the control box 40, a control board 52 is also provided. These control boards 51, 52 are to control operation of the electric components inside the indoor unit 10, for example, the fan 12, the drain pump, the indoor expansion valve and the like, and the electric wiring of the respective electric components is connected to these boards. The electric wiring of the electric components is led in through a hole formed in the rear side wall 44 of the control box 40.

The two terminal blocks 55, 56 are provided on the bottom wall 46 of the control box 40. These terminal blocks 55, 56 are disposed side by side in the right-left direction when viewed from the inspection port 48. The one terminal block 55 is to connect strong electricity wiring (first electricity wiring) including a power line, and the another terminal block 56 is to connect weak electricity wiring (second electricity wiring) used for communication or the like of control signals. An upper surface of the bottom wall 46 to which the terminal blocks 55, 56 are attached is inclined so that the inspection port 48 side is lower.

In the left and right side walls 42, 43 adjacent on both sides of the front side wall 41 formed with the inspection port 48, first leading ports 61, 62 configured to lead the strong electricity wiring and the weak electricity wiring into the control box 40 from the outside of the casing 11, respectively are formed. The left and right first leading ports 61, 62 are circular holes having the same diameter. Moreover, the first leading ports 61, 62 are disposed on a lower side of the left and right side walls 42, 43 near the terminal blocks 55, 56. The left and right first leading ports 61, 62 are disposed at positions opposed to each other.

The strong electricity wiring is led in from the first leading port 61 closest to the terminal block 55 for the strong electricity wiring. On the other hand, the weak electricity wiring is led in from the first leading port 62 closest to the terminal block 56 for the weak electricity wiring. This can make it easy to lay the strong electricity wiring and the weak electricity wiring inside the control box 40.

<Disposition of Control Box 40>

As described before, in one or more embodiments, the indoor unit 10 can selectively employ the first configuration in which the flow port 26A is formed in the bottom plate 17 of the casing 11 (refer to FIG. 1), and the second configuration in which the flow port 26B is formed in the rear side plate 19 of the casing 11 (refer to FIG. 2). The control box 40 of one or more embodiments is disposed in a state where the inspection port 48 is directed to the inside of the casing 11 in the first configuration, while in the second configuration, the control box 40 is disposed in a state where the inspection port 48 is directed to the outside of the casing 11. That is, the control box 40 is inverted between in the first configuration and in the second configuration.

Figure 6:
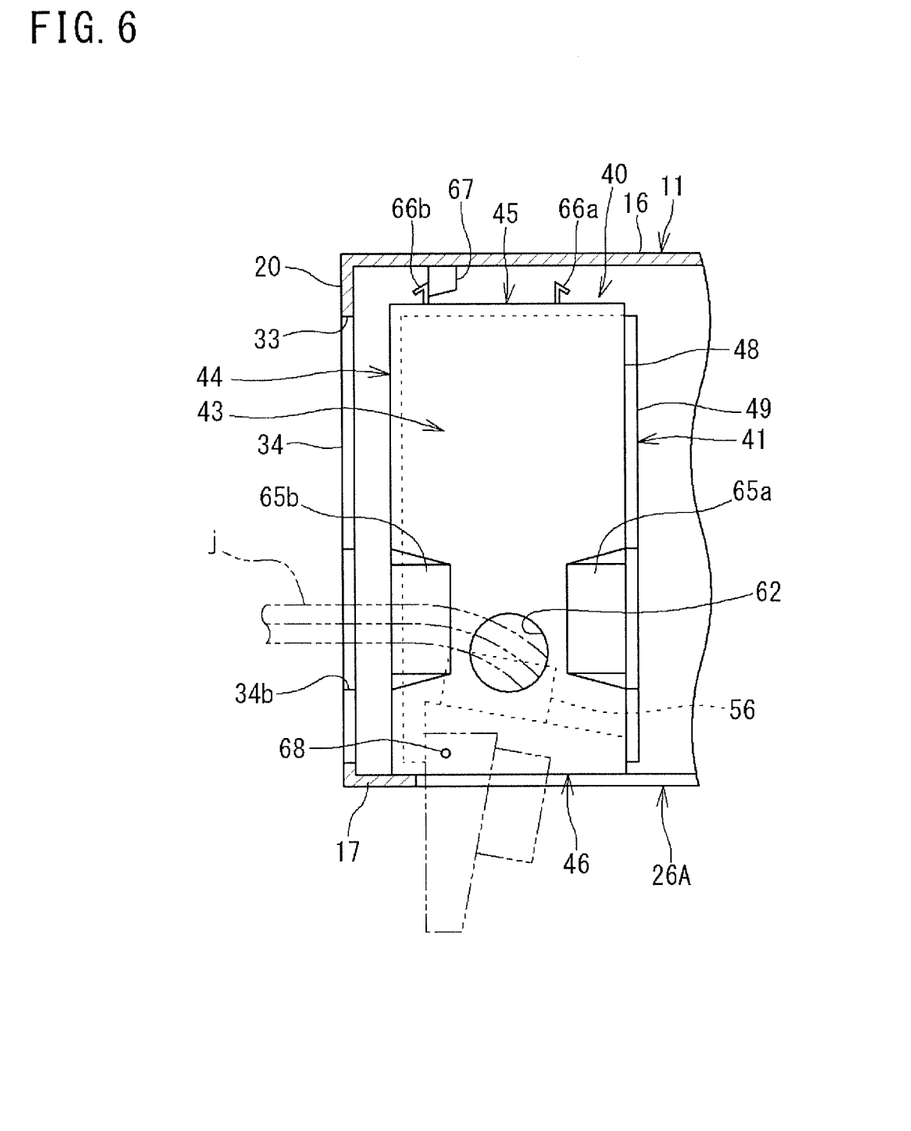
FIG. 6 is a view corresponding to a portion viewed from line A-A in FIG. 3 in a first configuration according to one or more embodiments.

FIG. 6 shows disposition of the control box 40 in the first configuration according to one or more embodiments. The inspection port 48 of the control box 40 is directed to the inside of the casing 11. The lid body 49 is mounted on the inspection port 48. The lid body 49 is detached to open the inspection port 48, by which the inside of the control box 40 can be accessed from the flow port 26A formed in the bottom plate 17 of the casing 11. The opening 33 formed in the left side wall 20 of the casing 11 is closed by the lid body 34.

Figure 7:
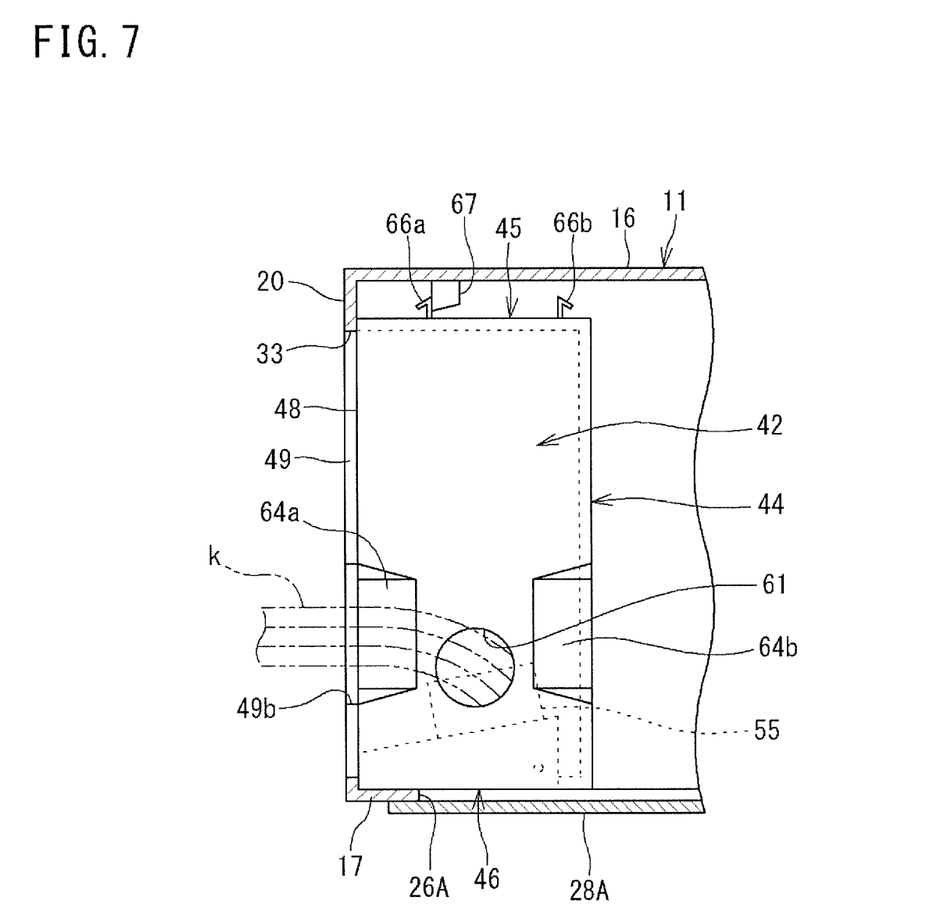
FIG. 7 is a view corresponding to the portion viewed from line A-A in FIG. 3 in a second configuration according to one or more embodiments.

FIG. 7 shows disposition of the control box 40 in the second configuration according to one or more embodiments. The inspection port 48 of the control box 40 is directed to the outside of the casing 11. The inspection port 48 is disposed so as to be opposed to the opening 33 formed in the left side plate 20 of the casing 11.

While in FIGS. 6 and 4 showing the first configuration, the opening 33 is closed by the lid body 34, in the second configuration, the lid body 49 closing the inspection port 48 closes the opening 33 as well at the same time. That is, the lid body 34 and the lid body 49 have substantially the same shape, and in the second configuration, the lid body 49 is used in place of the lid body 34. However, on the contrary, the lid body 34 closing the opening 33 may close the inspection port 48 at the same time. Moreover, the lid body 34 and the lid body 49 may close the opening 33 and the inspection port 48.

Figure 8:
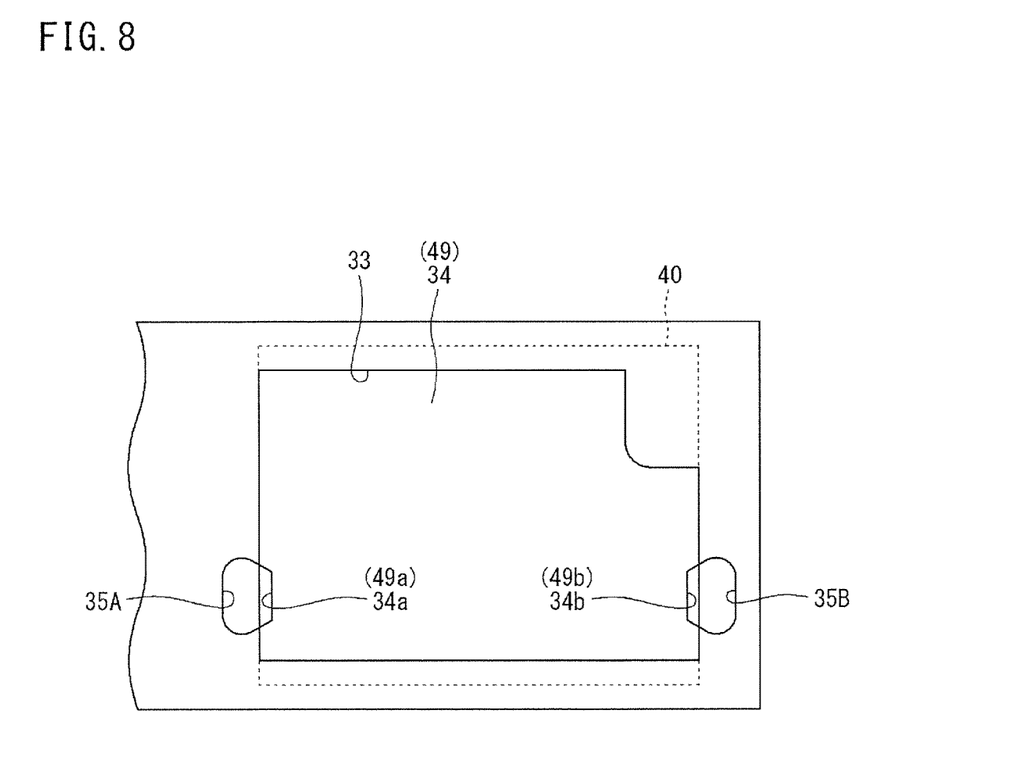
FIG. 8 is a front view of an opening formed in the casing according to one or more embodiments of the present invention.

In one or more embodiments as shown in FIG. 8, on both the right-left sides of the opening 33, the second leading ports 35A, 35B are formed. These second leading ports 35A, 35B are configured as depressed portions opened in a circumferential edge of the opening 33. The right-left second leading ports 35A, 35B are formed into a symmetrical shape centering around the opening 33.

On the other hand, in one or more embodiments, in both right-left edges of the lid body 34 (49) closing the opening 33, depressed portions 34a, 34b (49a, 49b) corresponding to the second leading ports 35A, 35B are formed. The second leading ports 35A, 35B and the depressed portions 34a, 34b (49a, 49b) form holes closed in whole peripheries.

The second leading ports 35A, 35B of the casing 11, and the first leading ports 61, 62 of the control box 40 are provided in a height overlapping each other. The electric wiring led in from the second leading ports 35A, 35B of the casing 11 can be led into the first leading ports 61, 62 of the control box 40.

Figure 9A:
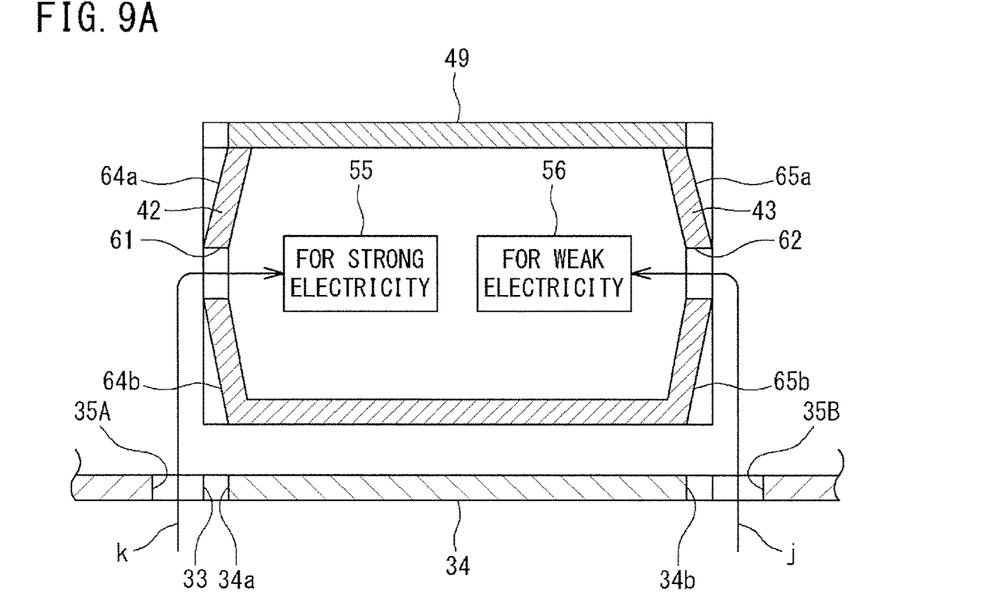
FIGS. 9A and 9B are each a view for describing a leading state of external wiring into the casing and the control box according to one or more embodiments of the present invention.

In one or more embodiments as shown in FIG. 9A, in the first configuration, since the terminal block 55 for the strong electricity wiring is disposed in the left side in the figure, strong electricity wiring k is led into the casing 11 from the second leading port 35A located on the left side, and further the strong electricity wiring k is led into the control box 40 from the first leading port 61 located on the left side. Accordingly, wiring connection working can be performed through a route closest to the terminal block 55 for the strong electricity wiring.

Moreover, since the terminal block 56 for the weak electricity wiring is disposed on the right side in the figure, the weak electricity wiring j is led into the casing 11 from the second leading port 35B located on the right side, and further, the weak electricity wiring j is led into the control box 40 from the first leading port 62 located on the right side. Accordingly, wiring connection working can be performed through a route closest to the terminal block 56 for the weak electricity wiring.

Figure 9B:
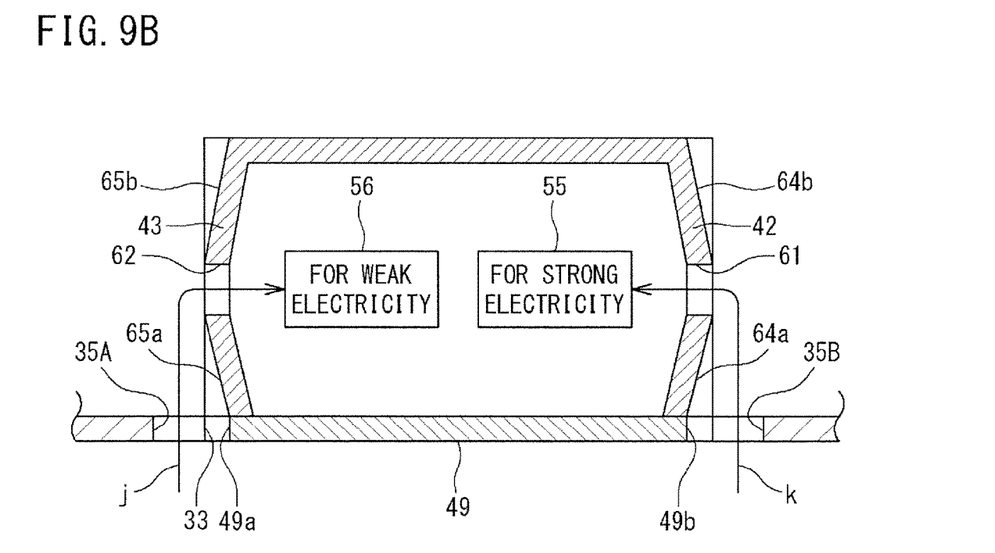

On the other hand, in one or more embodiments as shown in FIG. 9B, in the second configuration in which the control box 40 is inverted, since the terminal block 55 for strong electricity wiring is arranged on the right side in the figure, the strong electricity wiring k is led into the casing 11 from the second leading port 35B located on the right side, and the strong electricity wiring k is led into the control box 40 from the first leading port 61 located on the right side. Accordingly, the wiring connection working can be performed through a route closest to the terminal block 55 for the strong electricity wiring as in the first configuration.

Moreover, since the terminal block 56 for the weak electricity wiring is disposed on the left side in the figure, the weak electricity wiring j is led into the casing 11 from the second leading port 35A located on the left side, and the weak electricity wiring j is further led into the control box 40 from the first leading port 62 located on the left side. Accordingly, the wiring connection working can be performed through a route closest to the terminal block 56 for the weak electricity wiring as in the first configuration.

As described above, in one or more embodiments, in both the first configuration and the second configuration, the strong electricity wiring k and the weak electricity wiring j can be individually led in. Accordingly, influence by noise or the like attributed to leading in the strong electricity wiring k and the weak electricity wiring j from a common leading port can be avoided. Moreover, the terminal blocks 55, 56 can be connected without crossing the strong electricity wiring k and the weak electricity wiring j inside the control box 40 in both the first and second configurations. Accordingly, workability of the wiring connection working and maintenance working can be increased.

As shown in FIGS. 5 and 9, in the left and right side walls 42, 43 of the control box 40, guide paths 64a, 64b, 65a, 65b extending in the front-rear direction from the first leading port 61, 62 sides to the front side wall 41 and the rear side wall 44 respectively are formed. These guide paths 64a, 64b, 65a, 65b are each made of a depressed groove. Moreover, in each of the guide paths 64a, 64b, 65a, 65b, a groove bottom is formed into an inclined surface so as to be deeper as it becomes farther from the first leading ports 61, 62. The guide paths 64a, 64b, 65a, 65b disposed on both sides of the first leading ports 61, 62 are formed into a substantially symmetrical shape with respect to the first leading ports 61, 62.

The depressed portions 34a, 34b 49a, 49b formed in the lid bodies 34, 49 are each formed into a shape along an end edge on an open side of each of the guide paths 64a, 64b, 65a, 65b.

The formation of the above-described guide paths 64a, 64b, 65a, 65b enables the wiring led in from the second leading ports 35A, 35B of the casing 11 to be suitably guided to the first leading ports 61, 62 of the control box 40, so that the workability of the wiring connection working can be increased. Moreover, since the guide paths 64a, 64b, 65a, 65b are formed on both sides in the front-rear direction with the first leading ports 61, 62 interposed, in both the first configuration and the second configuration, the leading into the first leading ports 61, 62 can be easily performed.

Figure 10:
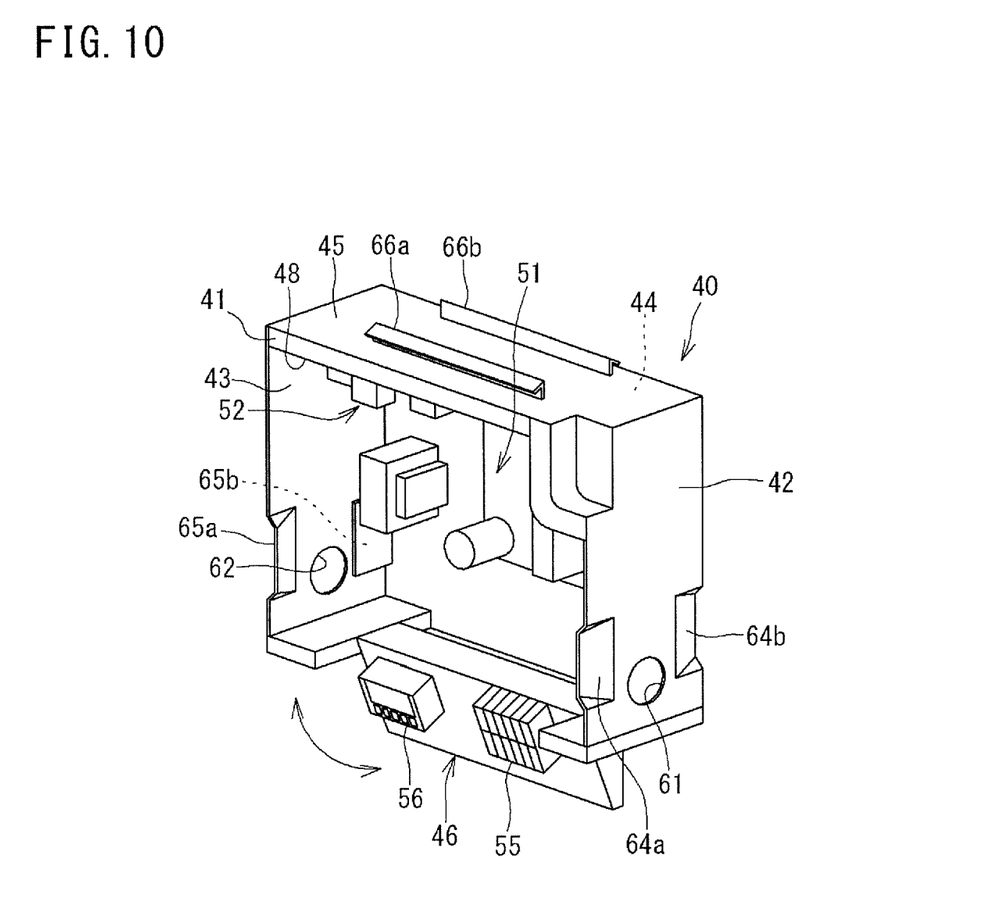
FIG. 10 is a perspective view showing a state where a bottom wall of the control box is opened according to one or more embodiments of the present invention.

In one or more embodiments as shown in FIG. 6, the bottom wall 46 of the control box 40 is provided vertically swingably through a support shaft 68 provided on both sides in the right-left direction in a rear portion thereof. As shown in FIG. 10, the bottom wall 46 is swung downward, by which the control box 40 can be opened downward.

The bottom wall 46 of the control box 40 is normally fixed in a state swung upward by a fixing screw not shown. In the first configuration, when the inspection of the control box 40 is performed from the flow port 26A, the fixing screw is detached to swing the bottom wall 46 downward, which can increase visibility of the inside of the control box 40, so that the access can be made easier. Moreover, since swinging the bottom wall 46 downward allows the terminal blocks 55, 56 provided in the bottom wall 46 to be largely exposed as well, the workability of the wiring connection working or the like to the terminal blocks 55, 56 can be increased.

In one or more embodiments as shown in FIGS. 6 and 7, in an upper surface of the upper wall 45 of the control box 40, engagement portions 66a, 66b projected upward are provided side by side in the front-rear direction. The respective engagement portions 66a, 66b are formed long in the right-left direction, as shown in FIG. 5. Moreover, in a lower surface of the top plate 16 of the casing 11, a support portion 67 projected downward is provided.

One of the engagement portions (a first engagement portion) 66b engages with a front side of the support portion 67 in the first configuration, which can prevent an upper side of the control box 40 from falling rearward. The other engagement portion (a second engagement portion) 66a engages with the front side of the support portion 67 in the second configuration, which can prevent the upper side of the control box 40 from falling rearward. Accordingly, in both first and second configurations, the one support portion 67 can support the control box 40. The engagement portions 66a, 66b may not be necessarily formed in the upper wall 45, but may be formed in the left and right side walls 42, 43, and in this case, the support portion 67 only needs to be formed in an inner surface of the casing 11 opposed to the side wall 42.

The present invention is not limited to the above-described embodiments, but modifications can be made as needed in a range of the invention described in the claims.

For example, the shape of the first leading ports 61, 62 formed in the left and right side walls 42, 43 of the control box 40 is not limited to a circle, but they can be formed into a polygonal shape or the like. Moreover, the two first leading ports 61, 62 may not be the same shape to each other. Moreover, both the first leading ports 61, 62 may be deviated from each other in the front-rear direction or vertically without being opposed to each other.

Moreover, the shape of the guide paths 64a, 64b, 65a, 65b formed both the front-rear sides of the first leading ports 61, 62 is not limited to the foregoing, either. For example, the shapes of the guide paths 64a, 65a on the front side of the first leading ports 61, 62, and the guide paths 64b, 65b on the rear side may be asymmetrical shapes different from each other in groove width, groove depth, groove length or the like.

The second leading ports 35A, 35B formed in the casing 11 of the indoor unit 10 may be independently formed at positions apart from the opening 33. Moreover, the left and right second leading ports 35A, 35B may not be formed into the symmetrical shape, but may be different from each other in size, vertical height, shape or the like.

In one or more embodiments, the bottom wall 46 of the control box 40 is configured vertically swingably with the rear end portion side as a supporting point, it may be provided vertically swingably with a right or left end portion side or a front end portion side as a supporting point. However, since the bottom wall 46 is configured vertically swingably with the rear end portion side as the supporting point, the access to the inside of the control box 40 from the flow port 26A is much easier.

In one or more embodiments, the two terminal blocks 55, 56 are for the strong electricity wiring and for the weak electricity wiring, respectively, the present invention is not limited thereto, but two terminal blocks 55, 56 for different purposes may be included.

In one or more embodiments, the case has been described in which the flow ports through which the air flows by the fan 12 are the flow ports 26A, 26B of the air, the relevant flow ports may be blowoff ports of air. For example, the flow of air by the fan 12 may be reversed, so that the blowoff port 23 may serve as a flow port, and the flow ports 26A, 26B may serve as blowoff ports.

Although the disclosure has been described with respect to only a limited number of embodiments, those skilled in the art, having benefit of this disclosure, will appreciate that various other embodiments may be devised without departing from the scope of the invention. Accordingly, the scope of the invention should be limited only by the attached claims.

REFERENCE SIGNS LIST

10: indoor unit
11: casing
12: fan
26A: flow port (suction port)
26B: flow port (suction port)
33: opening
35A: second leading port
35B: second leading port
40: control box
41: front side wall (first side surface)
42: left side wall (second side surface)
43: right side wall (third side surface)
44: rear side wall (fourth side surface)
46: bottom wall
48: inspection port
55: terminal block
56: terminal block
61: first leading port
62: first leading port
64a: guide path
64b: guide path
65a: guide path
65b: guide path
66a: engagement portion
66b: engagement portion
67: support portion
j: weak electricity wiring
k: strong electricity wiring

What is claimed is:

1. An indoor unit of an air conditioning system comprising:
    a fan;
    a control box comprising an inspection port on a first side surface; and
    a casing that houses the fan and the control box and that comprises:
        a first flow port in a bottom surface of the casing;
        a second flow port in a first side surface of the casing; and
        an opening opposed to the inspection port in a second side surface of the casing,
    wherein
    the control box comprises a first leading port on each of a second side surface and a third side surface of the control box, wherein the second side surface and the third side surface are opposed to each other and adjacent to the first side surface, and the first leading ports lead external wirings into the control box,
    the indoor unit has:
        a first configuration in which the inspection port is directed to an inside of the casing and air flows by the fan through the first flow port, and
        a second configuration in which the inspection port is directed to an outside of the casing and air flows by the fan through the second flow port, and
    the casing further comprises a second leading port on each of two opposing sides of the opening, wherein the second leading ports lead the external wirings into the casing.

2. The indoor unit of the air conditioning device according to claim 1, wherein the external wiring led into the first leading port on the second side surface is
a first electricity wiring, and the external wiring led into the first leading port on the third side surface is a second electricity wiring.

3. The indoor unit of the air conditioning device according to claim 1, wherein
the control box further comprises two terminal blocks disposed side by side within the control box in an opposite direction to the second side surface and the third side surface, and
the external wirings are individually led in the first leading port on the second side surface and the first leading port on the third side surface and connected to the respective terminal blocks.

4. The indoor unit of the air conditioning device according to claim 1, wherein
the control box further comprises on each of the second side surface and the third side surface:
first guide paths that extend from a first side of the first leading port to the first side surface, and
second guide paths that extend from a second side of the first leading port to a fourth side surface opposed to the first side surface, and
the first guide paths and the second guide paths guide the external wirings.

5. The indoor unit of the air conditioning device according to claim 1, wherein
the casing further comprises a support portion that engages with and supports the control box, and
the control box further comprises:
a first engagement portion that engages with the support portion in the first configuration; and
a second engagement portion that engages with the support portion in the second configuration.

6. The indoor unit of the air conditioning device according to claim 1, wherein
the control box further comprises two terminal blocks that are connected to the external wirings and disposed on a bottom wall of the control box, and
the bottom wall swings downward with one end side as a supporting point.

7. The indoor unit of the air conditioning device according to claim 2, wherein
the first electricity wiring is a power line, and
the second electricity wiring is a communication line.

* * * * *